United States Patent [19]
El-Ghoroury et al.

[11] Patent Number: 5,623,684
[45] Date of Patent: Apr. 22, 1997

[54] APPLICATION SPECIFIC PROCESSOR ARCHITECTURE COMPRISING PRE-DESIGNED RECONFIGURABLE APPLICATION ELEMENTS INTERCONNECTED VIA A BUS WITH HIGH-LEVEL STATEMENTS CONTROLLING CONFIGURATION AND DATA ROUTING

[75] Inventors: Hussein S. El-Ghoroury, Carlsbad; Dale A. McNeill, Encinitas; Charles A. Krause, Carlsbad, all of Calif.

[73] Assignee: Commquest Technologies, Inc., Encinitas, Calif.

[21] Appl. No.: 243,963

[22] Filed: May 17, 1994

[51] Int. Cl.$^6$ ............................................ G06F 15/00
[52] U.S. Cl. ........................ 395/800; 364/DIG. 2; 364/282.1; 364/283.1; 364/488; 364/489; 364/490; 364/491
[58] Field of Search ..................... 395/700, 800; 364/282.1, 283.1, 488, 489, 490, 491, 917.96

[56] References Cited

U.S. PATENT DOCUMENTS

| | | | |
|---|---|---|---|
| 4,951,221 | 8/1990 | Corbett et al. | 364/489 |
| 5,047,949 | 9/1991 | Yamaguchi et al. | 364/491 |
| 5,119,314 | 6/1992 | Hotta et al. | 364/491 |
| 5,173,864 | 12/1992 | Watanabe et al. | 364/491 |
| 5,197,016 | 3/1993 | Sugimoto et al. | 364/490 |
| 5,283,753 | 2/1994 | Schucker et al. | 364/490 |

OTHER PUBLICATIONS

Hwang; *Advanced Computer Architecture*; McGraw–Hill; 1993.
Fernandez, et al.; *Intro to 8080/8085 Assembly Language Programming*; John Wiley; 1981.
Employees of Borland, Inc.; *Turbo C++ Library Ref.*; 1990.

*Primary Examiner*—Alvin E. Oberley
*Assistant Examiner*—Jonathan Hall Backentose
*Attorney, Agent, or Firm*—Blakely, Sokoloff, Taylor & Zafman

[57] ABSTRACT

The architecture and design method of an application specific processor ("ASP") is disclosed. The ASP is designed by integrating selected pre-designed application elements contained in a library. These selected application elements can communicate with each other via a bus. Post-synthesis tailoring of the synthesized ASP is accomplished by using an instruction program which sequences the invocation of each application element and provides reconfiguration and data input/output routing commands thereto. A power management design is incorporated within the application elements allowing the majority of the application elements to be turned on only during periods of invocation.

18 Claims, 7 Drawing Sheets

APPLICATION SPECIFIC PROCESSOR ARCHITECTURE COMPRISING PRE-DESIGNED RECONFIGURABLE APPLICATION ELEMENTS INTERCONNECTED VIA A BUS WITH HIGH-LEVEL STATEMENTS CONTROLLING CONFIGURATION AND DATA ROUTING

BACKGROUND OF THE INVENTION

This invention relates generally to integrated circuits and more specifically to an integrated circuit architecture which allows complex integrated circuits to be easily designed.

Integrated circuit technology has advanced in the number of transistors on a chip from fewer than one hundred to many millions. As a result, it is possible to make integrated circuits (ICs or chips) which perform increasingly complex functions and thus to replace a large number of discrete components with one or several ICs, with commensurate benefits in the size, cost, and reliability of electronic systems constructed using ICs. The sizes of electronic systems incorporating these ICs decrease drastically. Since the costs of these ICs are much less than the costs of the replaced discrete components, the costs of manufacturing these electronic systems also decrease. Since the reliability of electronic systems increases as the number of interconnections decrease, the reliability of electronic systems with these ICs increases due to the reduction in the number of discrete components to be connected.

As a result of the above described advantages, many IC manufactures devote a substantial amount of research and development resources to increase the number of transistors that can be deposited on a single chip IC so that more complex circuits can be implemented by the chip. However, the complexity of the circuits and the large number of available transistors make designing ICs more difficult. Consequently, computer-aided IC design tools have been developed to make it easier for the IC designer to synthesize the desired logic and functionality without the need to manipulate transistors or gates.

Two approaches have been developed to help the IC designers: "standard cell" and "gate array." In the standard cell approach, commonly used functional blocks are carefully designed and stored in a cell library. Designers can retrieve and interconnect appropriate blocks to provide desired functions. Typically, these blocks are simple structures which can be interfaced by simply routing interconnect wiring to the appropriate input/output terminals of the blocks.

Gate array technology involves the fabrication of a large number of base wafers containing identical integrated circuit elements (gates) up to but not including the first level of conductive interconnect. The IC designers "customize" the gate array by specifying only the conductive patterns used to interconnect the pre-fabricated gates.

One of the problems of both of these approaches is that it is difficult to use them to design ICs which perform complicated functions. This is because the standard cells and gate arrays are basic building blocks for all types of applications. Consequently, it takes a lot of skill, time and effort to integrate these basic building blocks into useful circuits which perform complicated functions.

As an example, circuits used for communication applications typically perform complex signal processing operations. Such circuits include finite impulse response filters, infinite impulse response filters, PSK demodulators, and correlators. These circuits incorporate complicated mathematical algorithms which could be understood and implemented in silicon only by extremely skilled engineers. Consequently, it is very difficult to design these circuits using the basic building blocks which are available in standard cell library and gate arrays.

Some electronic system manufacturers adopt a completely different strategy to solve the above described problem. Instead of relying on custom designed ICs, they use general purpose processor ICs, such as microcontrollers and digital signal processors. Software is used to customize the function of these ICs.

One of the problems of using these general purpose ICs is that they are typically slower than ICs designed to handle a specific application. In many applications where processing speed is a critical factor, such as high speed communication systems, the performance of general purpose ICs is not acceptable. Further, the use of software does not avoid the requirement that highly skilled engineers are needed to implement the complicated mathematical algorithms.

SUMMARY OF THE INVENTION

Broadly stated, the present invention is a single chip semiconductor device containing a bus for connecting between and among a plurality of "application syntax." The device can process digital and/or analog signals. Further, the device can perform signal and/or data processing functions. The application syntax are selected from a library of application syntax. These selected application syntax communicate via the bus and cooperatively perform a user specified function. The bus can carry commands, data and/or timing signals. Each selected application syntax includes a functional block which performs a predetermined function and an interface block which interfaces the functional block to the bus.

In the architecture of the present invention, an application syntax is preferably designed in a manner which captures a highly complex, but frequently used, type of data transformation into a single functional block. These application syntax can be considered primitive building blocks of an integrated circuit. They are a priori designed, implemented, and optimized for a target technology (for example, a specific microelectronics integration technology, such as CMOS). The collection of application syntax pertaining to a specific application are grouped in a catalog which is distributed to potential users. When it is time to design an integrated circuit that performs a particular user specified function, the appropriate application syntax are selected from the catalog.

The library of application syntax (which is comprised of one or several application specific catalogs) can be used to design a large variety of products. For example, if the catalog contains communication system related application syntax, it can be used to design products for cellular telephones, wireless local area networks, personal communication networks, and digital cable networks. As a result, the costs of designing the application syntax can be spread among many users of the catalog.

From the IC designer's perspective, each application syntax could be considered a "black box," with well defined input and output characteristics. Thus, there is no need for users of the catalog to have an in-depth understanding of how to implement these complex application syntax. The users only need to work with the system level functional building blocks. It is much easier and faster to design systems using these application syntax than to implement the same functionality by selecting, arranging and connecting standard cells or interconnecting thousands of gates. As a result, the costs and time-to-market of a product are significantly reduced.

A common problem encountered by product developers is how to reduce the costs of product enhancement and evolution. If a product is designed using the application syntax of the present invention, it is quite easy to change or add features to the product by removing and inserting application syntax. There is no need to re-design an entire system. Thus, the costs of product enhancement and evolution are reduced.

The interconnection between the application syntax of the present invention allows for loose coupling using a single bus such that a set of application syntax can operate asynchronously. Each application syntax on the bus can be invoked simultaneously (parallel processing) or staggered in time (pipeline processing). In addition, the application syntax can be enabled only at a time when its functionality is needed. Because the power usage of an application syntax depends on whether it is enabled, this feature allows for efficient power management.

The bus is used to carry both commands and data. The commands and data can be paired such that they are transmitted simultaneously by a single access to the bus. The number of words in the bus allocated to the commands and data can vary in each access. This "moving boundary" feature allows maximization of the efficiency of the bus.

The architecture of the present invention allows for distributed control. Each application syntax is capable of generating and sending commands and data to other application syntax. Thus, no central controller is required. This distributed control approach allows efficient implementation of highly time ordered, multi-mode application specific processing. However, the architecture of the present invention also allows an application syntax to control the operation of other application syntax in the integrated circuit. When one application syntax becomes a central controller for a group of other application syntax, the controlled application syntax are designated as an application syntax cluster.

The application syntax and interface architecture of the present invention allow application syntax with wide interface bandwidth needs to be interconnected as a group with a single physical interface which is separate from the above described bus. This application syntax 'clustering' allows the interconnect interface bandwidth to be tailored for matching the bandwidth of data flow within the integrated circuit. This feature avoids data flow congestion.

The versatility of the ASP architecture is enhanced by its programmability feature. The adaptability of the application syntax and interface architecture of the present invention to different control mechanisms (distributed, centralized, or hybrid control) and to different interface bandwidth needs is an aspect of the ASP programmability. With the ASP programmability feature, the routing between application syntax, the configuration of application syntax, and the application syntax invocation times are programmable. Application syntax parameters can be set to a fixed value or controlled by a program. The program can be stored in an ASP memory or downloaded from an external entity.

One of the applications of the application syntax is in the area of digital communication. The application syntax contain complicated algorithms, such as digital filtering, correlating, and error correction. In the architecture of the present invention, a communication system designer does not have to understand the details of these algorithms. Complicated communication products, such as a spread spectrum, frequency hopping, time division multiple access modems, can be designed by merely selecting and combining the appropriate application syntax to provide the desired functionality.

Other aspects and advantages of the present invention will become apparent from the following description of the invention, taken in conjunction with the accompanying drawings and tables, which disclose, by way of example, the principle of the invention.

DETAILED DESCRIPTION OF THE INVENTION

The present invention involves a processor architecture in which a plurality of functional elements, each designed to performed a specific function, are connected together to cooperatively perform a task. The architectural context in which these functional elements are integrated and the aggregation of the functional elements in order to perform the application dependent processing are referred herein as an application specific processor (ASP). Individual functional elements are called application syntax. An application syntax is typically highly complex, yet frequently used, type of data transformation. These application syntax could implement a digital or a combination of digital and analog functions.

Figure 1:
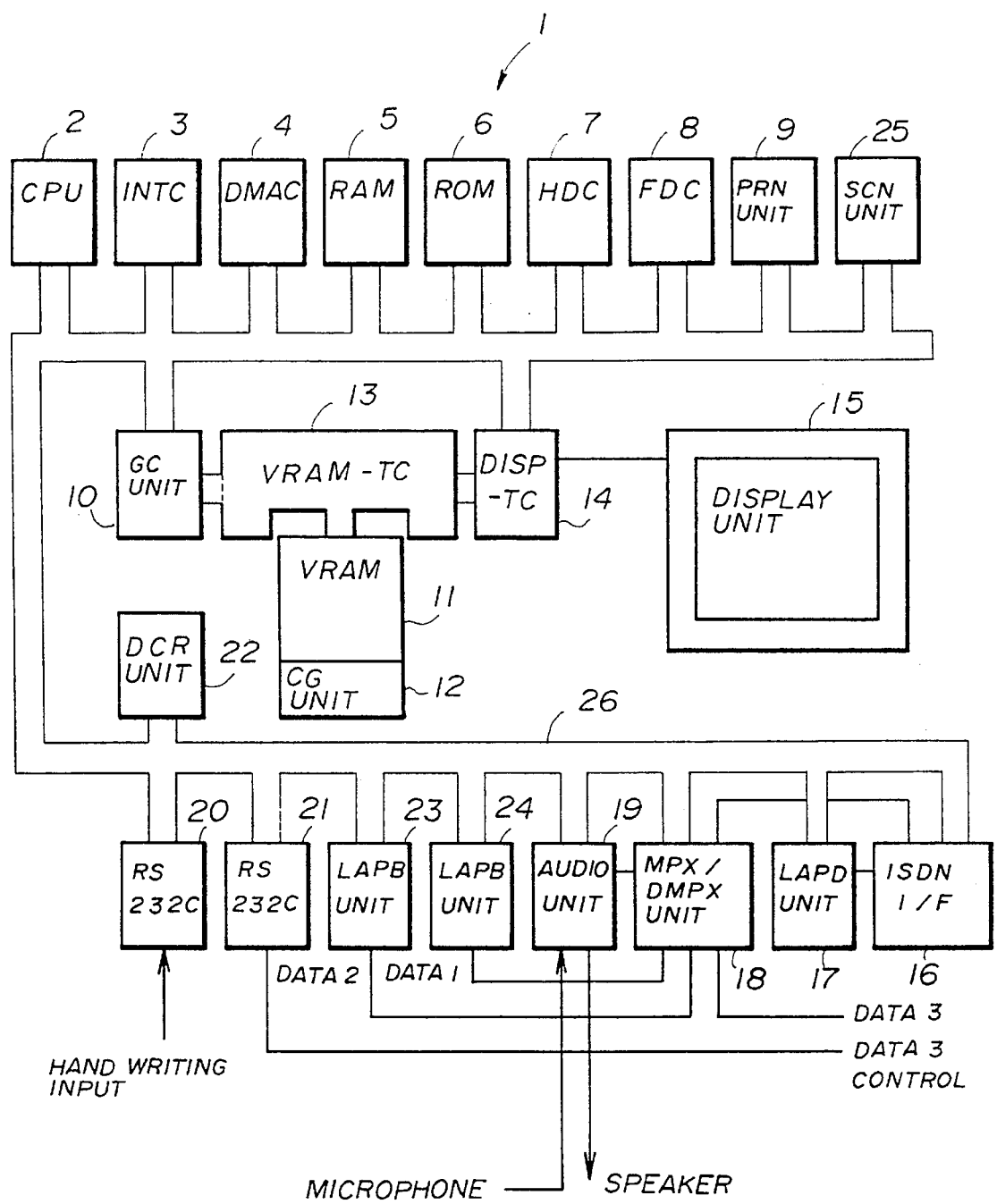
FIG. 1 is a block diagram illustrating the application specific processor (ASP) architecture of the present invention.

FIG. 1 is a schematic diagram of the ASP architecture 100 of the present invention. It shows a Command/Data/Timing bus 110 and a plurality of application syntax, such as application syntax 111, 112, and 113. These application syntax could be different, or some of them could be the same. Communication between the application syntax are carried out through the Command/Data/Timing bus 110.

Each application syntax contains essentially the same circuits for interfacing with the Command/Data/Timing bus 110. Thus, it is sufficient to describe in detail the interface circuits of only one of the application syntax, such as application syntax 111. Application syntax 111 contains a clock enable logic block 121, an interface access logic block 123, and an application syntax logic block 125. The application syntax logic block 125 performs a predefined function. For example, FIG. 1 indicates that the application syntax logic block 125 operates on user data that is supplied to the application syntax 111 through a bi-directional path designated the external interface 131 line. The clock enable logic block 121 and interface access logic block 123 interface the application syntax logic block 125 to the Command/Data/Timing bus 110. The clock enable logic block 121 provides the application syntax logic block 125 with timing signals and enables the application syntax logic block 125 only at the time when its function is needed. The interface access logic block 123 allows application syntax logic block 125 to receive commands and data from, and send commands and data to, other application syntax via the Command/Data/Timing bus 110.

In the ASP architecture 100, the structures of the clock enable block 121 and interface access logic block 123 in each application syntax are substantially the same, although some unique components, such as the application syntax's address, are different. Some of the components in the application syntax block 125 are also common to all the application syntax (e.g., components interfacing with the clock enable block 121 and interface access logic block 123). However, circuits in the application syntax which perform specific data and signal processing functions may be different (e.g., one application syntax functions as a demodulator, another functions as a CRC checker, etc.). Briefly stated, the application syntax may perform different functions, but the portions of the application syntax for interfacing to the Command/Data/Timing bus 110 are substantially the same. As a result, the application syntax can interface to one another using the Command/Data/Timing bus 110.

Figure 2:
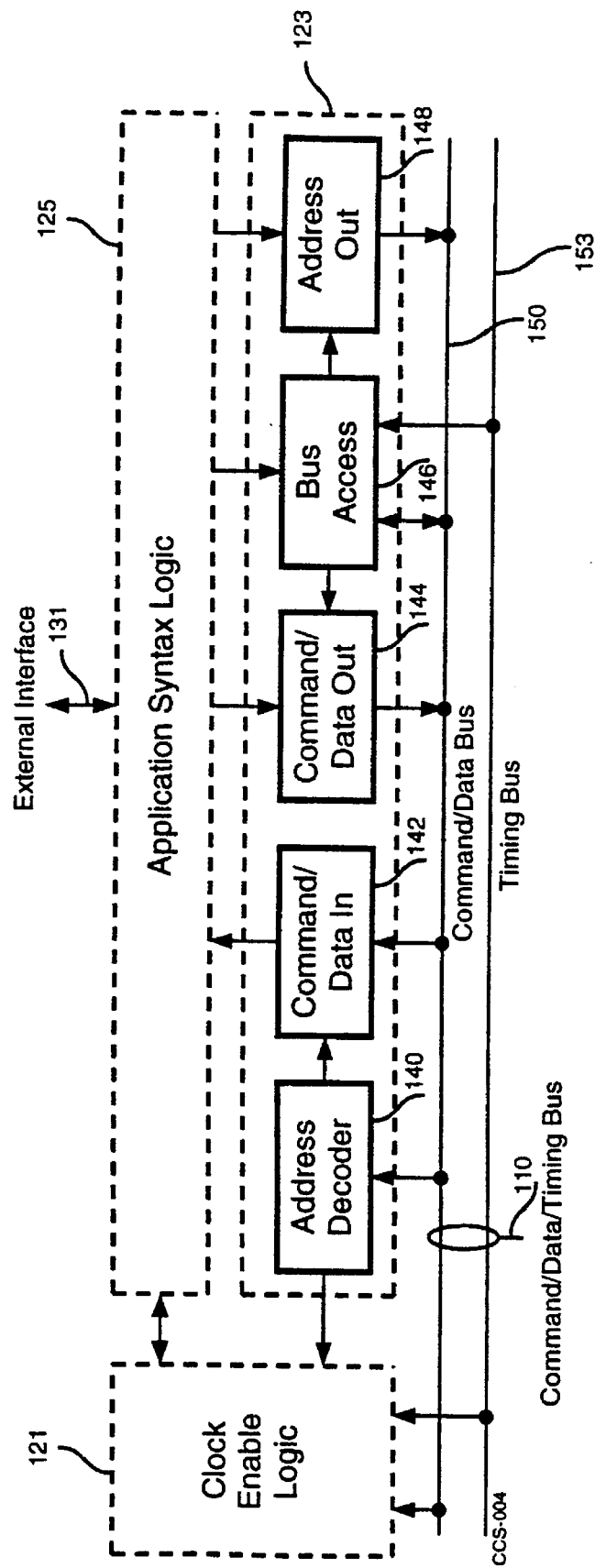
FIG. 2 is a block diagram of an interface access logic block in an application syntax of the present invention.

FIG. 2 shows a detailed block diagram of the interface access logic block 123, shown in FIG. 1. Like numerals in FIG. 1 and 2 denote like elements. The interface access logic block 123 contains an address decoder 140 connected to a command/data in block 142 and the clock enable logic block 121. The address decoder 140 receives address signals from the command/data bus 150 and causes the command/data in block 142 and the clock enable logic block 121 to accept commands and data which are intended for application syntax 111. The command/data bus 150 is a part of the Command/Data/Timing bus 110, shown in FIG. 1. The command and data processed by the command/data in block 142 is sent to the application syntax block 125. The interface access logic block 123 also contains a command/data out block 144 and an address out block 148. These two blocks transmit the command, data, and address information generated by the application syntax logic block 125 to the command/data bus 150. The interface access logic block 123 also contains a bus access circuit 146 which is connected to the command/data out block 144 and address out block 148.

The two command/data blocks 142 and 144 operate on an input/output format which consists of a pair of commands and data, each of varying size. The aggregate size of the commands and data are based on the operational needs of the specific application syntax logic. The described command and data pairing has moving boundaries which allows maximization of the physical interface (i.e., Command/Data/Timing bus 110) efficiency.

Because the structure of the interface access logic block 123 is substantially the same for all the application syntax, it is possible for one application syntax to send commands and data to another application syntax through the Command/Data/Timing bus 110. This "data driven" distributed control approach allows efficient implementation of highly time ordered, multi-mode application specific processing. Thus, in this architecture, there is no need for the control approach to be restricted to a fully centrally controlled approach; rather a distributed control, centralized control or a hybrid control approach can be used to best match the needs of the intended application. The ability of an application syntax to generate commands to other application syntax allows one application syntax to become a central controller for a group of other application syntax, which are designated as an application syntax cluster.

Another advantage of this architecture is that the Command/Data/Timing bus 110 is hidden from the application syntax logic (i.e., the application syntax logic need not know the details of the bus operation) Thus, the designer of the specific function for an application syntax does not have to know the bus operation and as a result, there is a gain in economy.

Figure 3:
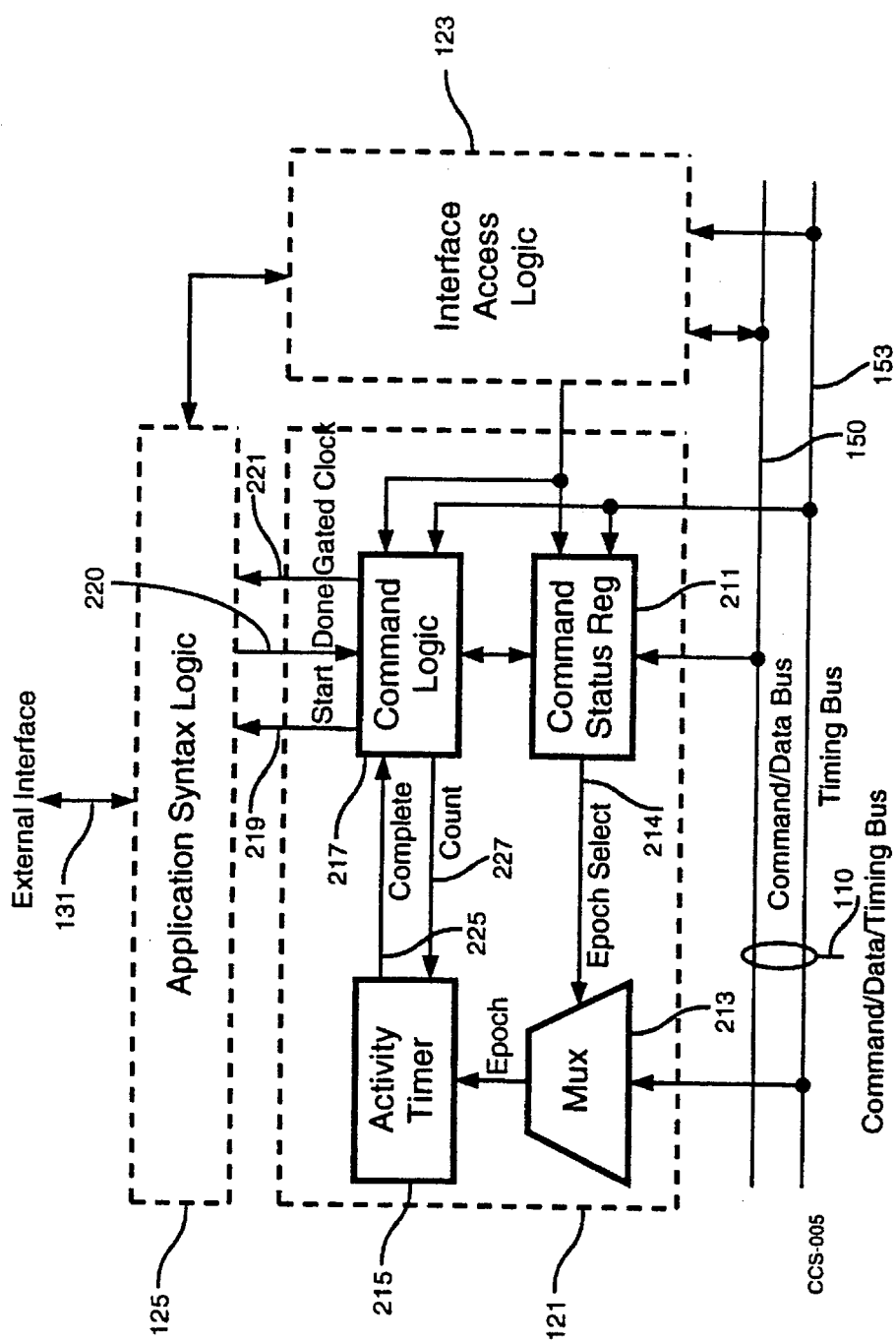
FIG. 3 is a block diagram showing a clock enable logic block in an application syntax of the present invention.

FIG. 3 shows a detailed block diagram of the clock enable logic block 121, shown in FIG. 1. Like numerals in FIGS. 1, 2 and 3 denote like elements. The clock enable logic block 121 contains a command status register 211 which accepts input from the timing bus 153, the command/data bus 150, and the address decoder 140 of the interface access logic block 123. The timing bus 153 is a part of the Command/Data/Timing bus 110 and typically contains a plurality of clock signals carried on different lines.

The command status register 211 receives time-related commands and data which are addressed to application syntax 111. The command status register 211 uses these commands and data to determine a mux select value and a epoch modulo value. The mux select value is sent to the multiplexer 213 through a set of mux select lines 214 so that the multiplexer 213 can select the desired clock (or epoch) from the timing bus 153. The epoch modulo value is sent to a command logic block 217 and defines the modulo therein (i.e. number of epochs to count before enabling a gated-clock), as explained below.

The output of the multiplexer 213 is connected to an activity timer 215. The activity timer 215 also receives a "count" signal from the command logic block 217 through a line 227. This count signal corresponds to the epoch modulo value, described above, in the command logic block 217. The activity timer 215 uses this count signal to count the epochs (selected by the command status regisgter) and sends a "complete" signal through a line 225 to the command logic block 217. The command logic block 217 then enables a gated-clock and generates a start signal (synchronous to the gated-clock). The start signal and gated-clock are coupled to the application syntax logic block 125 via lines 219 and 221, respectively. The command logic block 217 receives a "done" signal from the application syntax block 125 via a line 220. The command logic block 217 also contains circuits which allow it to enable and disable the gated-clock via commands from the command status register 211.

The clock enable logic block 121 causes the application syntax logic block 125 to be activated at specific occurrences of the specified timing epoch. For example, the clock enable logic block 121 can be configured to activate the application syntax logic block 125 at predefined epochs and disable the gated-clock during idle times, thereby limiting power dissipation of the application syntax 111. Furthermore, the clock enable logic block 121 allows the autonomous operation of the application syntax based on timing epochs distributed throughout the system. Thus, by allowing each application syntax to be enabled only at the time when its function is needed to be invoked, both the time ordering of data processing and efficient power management become inherent aspects of the architecture.

Figure 4:
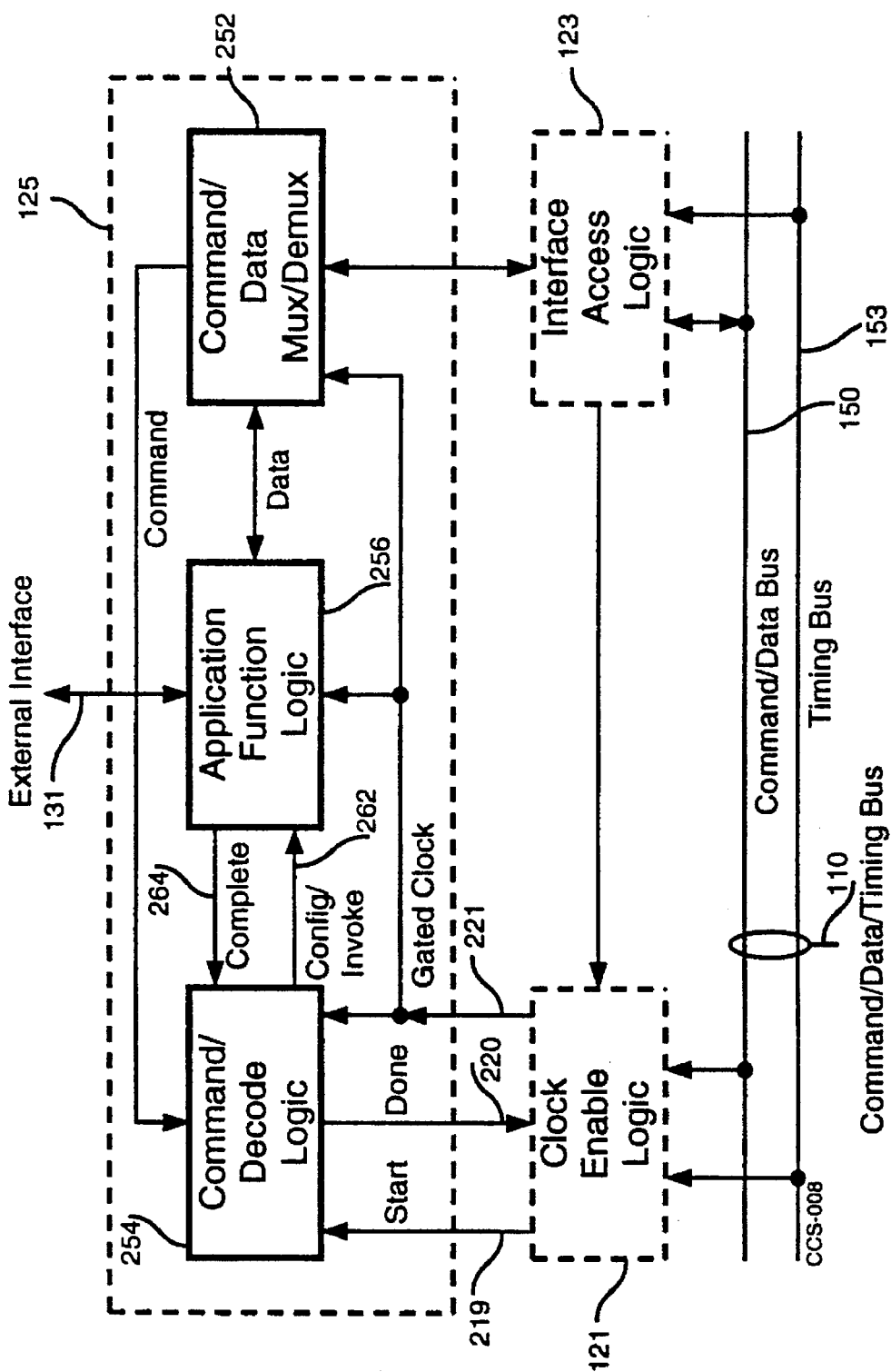
FIG. 4 is a block diagram showing an application syntax logic block in an application syntax of the present invention.

FIG. 4 shows a detailed block diagram of the application syntax logic block 125, shown in FIG. 1. Like numerals in FIGS. 1, 2, 3 and 4 denote like elements. The application syntax logic block 125 contains an application function logic block 256 which performs predefined functions unique to an application syntax, such as transformation of the user data supplied via the external interface 131 line. That is, application function block 256 contains circuits which are not part of the interface structure common to all application syntax. Application syntax logic block 125 also contains a command/data mux/demux block 252 which receives commands and data from the interface access logic block 123 and the gated-clock signal from the clock enable logic block 121. The command/data mux/demux logic block 252 extracts commands (for delivery to a command/decode logic block 254) and data (for bi-directional communication to an application function logic block 256) received from the interface access logic block 123.

The command/decode logic block 254 can be considered the controller of the application logic block 125. It controls the operation of the application syntax function logic block 256 via a line 262. That is, command/decode logic block 254 accepts commands from the interface access logic block 123 via the command/data mux/demux block 252, interprets those commands, and controls the operation of the application function logic block 256. An example of the operations are (i) configuring the application function logic block 256, and (ii) invoking a particular predefined transformation of the user data supplied by the external interface 131 line. Upon completion of a command, the application function logic block 256 sends a "complete" signal to the command/decode logic block 254 via a line 264.

As explained above, the start signal on 219 received by the command/decode logic block 254 is used to synchronize the invocation of the application function logic block 256. The command/decode logic block 254 also generates a "done" signal and transmits it (via line 220) to the clock enable logic block 121, which in turn disables the gated-clock to the command/decode logic block 254, the application function logic block 256, and the command/data mux/demux block 252. Disabling the gated-clock to these blocks essentially turns them off. Conversely, enabling the gated-clock turns them on.

As pointed out above, the application function logic block 256 in the application syntax is specifically designed to perform a predefined function. Each application syntax defines an application specific function which is a priori designed, implemented, and optimized for a target technology (for example, a specific microelectronics integration technology). A set of application syntax which perform different data and signal transformation functions can be put into a catalog. When it is time to design a system for a certain application (e.g., a modem for wireless communication), appropriate application syntax are selected from the catalog and placed on a Command/Data/Timing bus so that they can perform the desired function.

The catalog can be considered a collection of instructions in a programming language. A user can select the appropriate subset of instructions from the catalog to implement a programmable ASP which is matched to the intended application. The instruction set can be tailored to match the specific processing needs of a target application (for example, digital communications). The ASP Architecture is an architecture in which instructions in the instruction set can be combined to work in a cooperative manner to perform a certain application. The individual members of this application specific instruction set is designed in a manner which captures a highly complex, yet frequently used, type of data transformation into a single "syntax" which can be addressed as a primitive instruction at the application level. This type of syntax is referred to as an "application syntax." Examples of the physical embodiment of these syntax are the application syntax 111, 112, and 113, discussed above in connection with FIGS. 1–4.

Within the ASP architecture, an application syntax is invoked with two sets of fundamental arguments, namely, command (C) and time (T). In terminology analogous to software programming, the structure of the syntax is "Syntax (C, T)." Each syntax, when invoked, transforms a designated input array, data structure, and/or commands into an output by applying an application specific transformation or mapping. The command (C) argument of a syntax allows specific control parameters embedded with the application syntax to be set at desired values and hence allows the transformation performed by an application syntax to be varied from one invocation to another without altering the type of functional transformation performed. For example, within a Communication Application Specific Processor (CASP), an application syntax can be defined to be a filter function with the command argument allowing the filter bandwidth to be varied. The time (T) argument of the syntax allows the application syntax to be invoked at specific time epochs, where the value of the argument (T) specifies the time at which the application syntax is to be invoked or the time interval between successive invocations.

In the embodiment presented in FIGS. 1–4, the command arguments are transmitted on command/data bus 150 and processed by the interface access logic block 123 and the clock enable logic block 121. The time arguments are transmitted on the timing bus 153 and processed mainly by the clock enable logic block 121.

The ASP architecture allows a set of application syntax to be invoked simultaneously (parallel processing), staggered in time (pipeline processing), or sequential in time (non-overlapping processing). This capability allows considerable flexibility in the system design choices. Invocations simultaneous in time (parallel processing) allow high processing throughput to be realized. Invocations staggered in time (pipeline processing) or sequential in time (non-overlapping processing) allow one application syntax to act as a preprocessor for another application syntax. The time (T) argument of each application syntax determines the alignment of invocation epochs to realize the most efficient processing relative to another application syntax.

Appropriate application syntax are selected from the library containing the complete set of available application syntax. The architectural design allows any set of application syntax to be interconnected in a fully connected topology, which permits data flow between any two application syntax. This interconnection is based on a loose coupling, whereby a set of application syntax can operate asynchronously.

The versatility of the ASP architecture is enhanced by its programmability feature. The adaptability of the application syntax and interface architecture of the present invention to different control mechanisms (distributed, centralized, or hybrid control) and to different interface bandwidth needs is an aspect of the ASP programmability. With the ASP programmability feature, the routing between application syntax, the configuration of application syntax, and the application syntax invocation times are programmable. Application syntax parameters can be set to a fixed value or controlled by a program. The program can be stored in an ASP memory or downloaded from an external entity (which could be another IC designed using the ASP architecture of the present invention).

The ASP architecture targets implementations incorporating microelectronic integrated circuit technologies as well as board level technologies. Further, it can be implemented in both hardware and/or software. Because the constituent processing and invocation mechanisms are matched to a specific application, the ASP architecture offers the maximum throughput which can be achieved by the target technology with sufficient programming flexibility to realize the low cost benefits achieved by aggregating the production volume of several product markets with common processing needs. For example, it is possible to build a library in which the digital communication signal processing needs for the combined markets of several products, including cellular telephones, wireless local area networks, personal communication networks, digital cable networks, etc., are accommodated. The architecture also enables leveraging the expertise of applications experts to realize lower product design cost and shorter time-to-market advantages and allows system level object oriented programmability, which obviates the need for in-depth understanding of the complex aspects of a specific application processing. The rapid development cycle of efficient application specific circuits with inherent power management capabilities and the programming flexibility for addressing product enhancement and evolution with vastly reduced development cost are major benefits of this architecture.

One application of the ASP architecture of the present invention is a communication application specific processor (CASP). Table 1 shows the names and description of some of the application syntax in a catalog which can be used to design various CASPs.

TABLE 1

Communication Application Syntax Catalog

| Name | Description |
| --- | --- |
| Interleaver | Convolutional and block interleaving with selectable row and column sizes. |
| Deinterleaver | Convolutional and block deinterleaving with selectable row and column sizes. |
| Encoder | Convolutional encoding with selectable rate, constraint length, and taps. |
| Decoder | Convolutional decoding with selectable rate, constraint length, and taps. |
| CRC Checker | Cyclic Redundancy Code checker with selectable length and taps. |
| Reed-Solomon Decoder | Reed-Solomon decoding with selectable length. |
| BCH Decoder | BCH decoding with selectable length and syndrome calculation. |
| FIR Filter | FIR filter with selectable number of co-efficients and coefficient values. |
| IRR Filter | IRR filter with selectable coefficient values. |
| PSK Demodulator | PSK demodulator with selectable type and rate. |
| FSK Demodulator | FSK demodulator with selectable number of tones, tone frequencies, and rates. |
| Correlator | Correlator with selectable length and taps. |
| State Machine | Generic State Machine with selectable number of states, boundary conditions, and outputs. When used in conjunction with application specific microcode, it provides implementation of a wide variety of application syntax. |

An exemplary communication system designed using the ASP architecture of the present invention is a modulator/demodulator (modem) implementing a spread spectrum, frequency hopping (SS/FH), time division multiple access (TDMA) signaling scheme. The SS/FH aspect is provided by randomization of the carrier frequency of each burst. The TDMA aspect is provided by dividing time on the channel into TDMA bursts, with the multiple access duty cycle defined as a frame. The time position of an assigned burst within a frame is randomized. The multiple access scheme assigns dynamically on demand a data stream to each burst to support the user data. Each burst is defined by a set of parameters shown in Table 2.

TABLE 2

SS/FH Burst Parameters of Modem 400

| | |
| --- | --- |
| Carrier Frequency | Carrier frequency derived using a specified pseudo random code (PN-Code) generator. |
| Modulation type | Binary Phase Shift Keying (BPSK) or Quatemary Phase Shift Keying (QPSK). |
| Matched Filter Parameters | Coefficients for matched filter. |
| Data Rate | Variable number of symbols per burst. |
| Interleaver Parameters | Variable number for length and width. |
| Coding Type | None or convolutional encoding/Viterbi decoding. |
| Coding Parameters | Rate = ½, ¾, ⅞; Constraint Length = 7, 9. |

Figure 5:
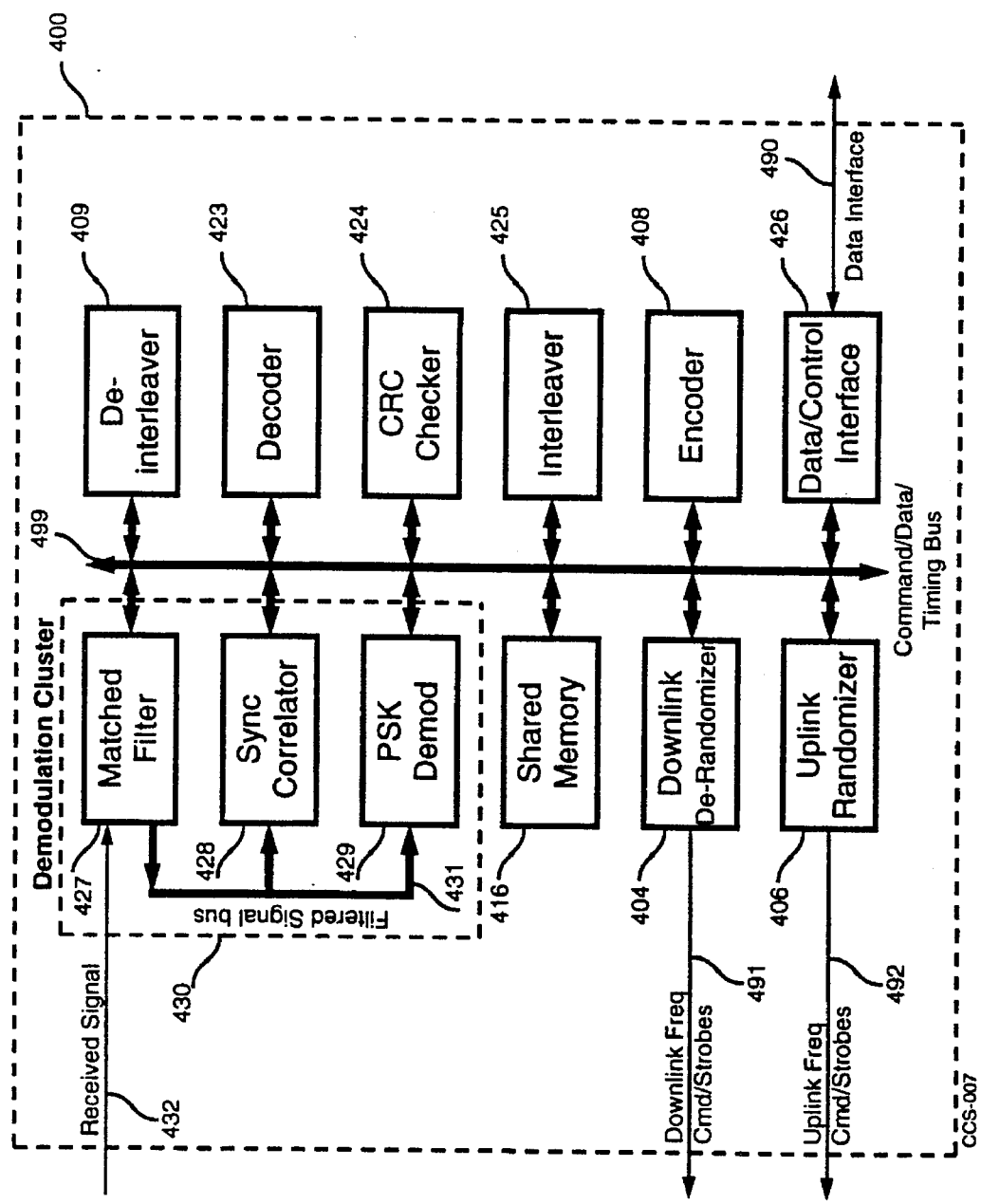
FIG. 5 is a block diagram of a modem implemented using the communication application specific architecture of the present invention.

FIG. 5 depicts a top level block diagram of a SS/FH TDMA modem 400 implemented using the CASP. Specifically, the application syntax utilized in the example are shown in Table 3. These application syntax communicate through a command/data/timing bus 499, where each application syntax can be invoked (or activated) at different rates. Bus 499 is a realization of the Command/Data/Timing bus 110 of FIG. 1.

Each application syntax defined in modem 400 accepts an input configuration command which governs the data transformation and an input timing command which governs the invocation time. This command structure has been defined as Syntax (C,T) in the ASP architecture of FIG. 1. An application syntax, upon invocation, sets its parameters to the appropriate values, processes the input data, and gates its input clock off until the next invocation command occurs. Thus, power savings are inherently provided by gating the clock off. The application syntax defined in modem 400 have different application syntax logic (i.e., block 125 of FIG. 1) for performing different signal processing functions. However, all of these application syntax utilize the same interface structure to connect to the command/data/timing bus 499.

TABLE 3

Application Syntax Used to Implement CASP Modem 400

| Name | Description |
| --- | --- |
| Downlink De-Randomizer | An autonomous application syntax which performs burst-by-burst control of the demodulation cluster and generates downlink burst/frame clocks and downlink synthesizer frequency hopping commands. Implemented using the state machine syntax of Table 1. |
| Uplink Randomizer | An autonomous application syntax which generates uplink burst/frame clocks and uplink synthesizer commands containing the uplink modulation and frequency hopping commands. Implemented using the state machine syntax of Table 1. |
| Matched Filter | Part of demodulation cluster configured at the burst rate to perform matched filtering of the received signal. |
| PSK Demodulator | Part of demodulation cluster configured at the burst rate to perform BPSK or QPSK demodulation of the filtered signal. |
| Sync Correlator | Part of the demodulation cluster configured at the burst rate to calculate synchronization metrics for time and frequency tracking. |
| Deinterleaver | Autonomous application syntax configured dynamically to deinterleave data at the frame rate. |
| Decoder | Autonomous application syntax configured dynamically to decode data at the frame rate. |
| CRC checker | Autonomous application syntax configured dynamically to check the decoded data stream for errors. |
| Encoder | Autonomous application syntax configured dynamically to encode data at the frame rate. |
| Interleaver | Autonomous application syntax configured dynamically to interleave data at the frame rate. |
| Shared Memory | Autonomous application syntax consisting of a block of memory with capability to interface with internal Command/Data/Timing Bus. |
| Data/Control Interface | Autonomous application syntax designed to connect an external bus to the internal Command/Data/Timing Bus. |

In modem 400 of FIG. 5, both the centralized as well as the distributed control aspects of the ASP architecture are used to support dynamic modem reconfiguration on a burst-by-burst basis and data processing on a frame-by-frame basis. The centralized control is provided by a downlink de-randomizer 404 and an uplink randomizer 406, which coordinate the downlink and uplink digital signal processing, respectively, on a burst-by-burst basis. The distributed control is provided by autonomous application syntax on a frame-by-frame basis for data processing. Specifically, these autonomous application syntax are the encoder 408, the interleaver 425, the CRC checker 424, the decoder 423, and the deinterleaver 409.

The modem 400 incorporates a shared memory syntax 416, which provides a loose coupling between all application syntax. This eliminates the hardware overhead of multiple separate data and address lines as well as separate memories. Each application syntax performs its particular task(s) on its input data and passes its output to the next application syntax via the shared memory syntax 416.

Figure 6:
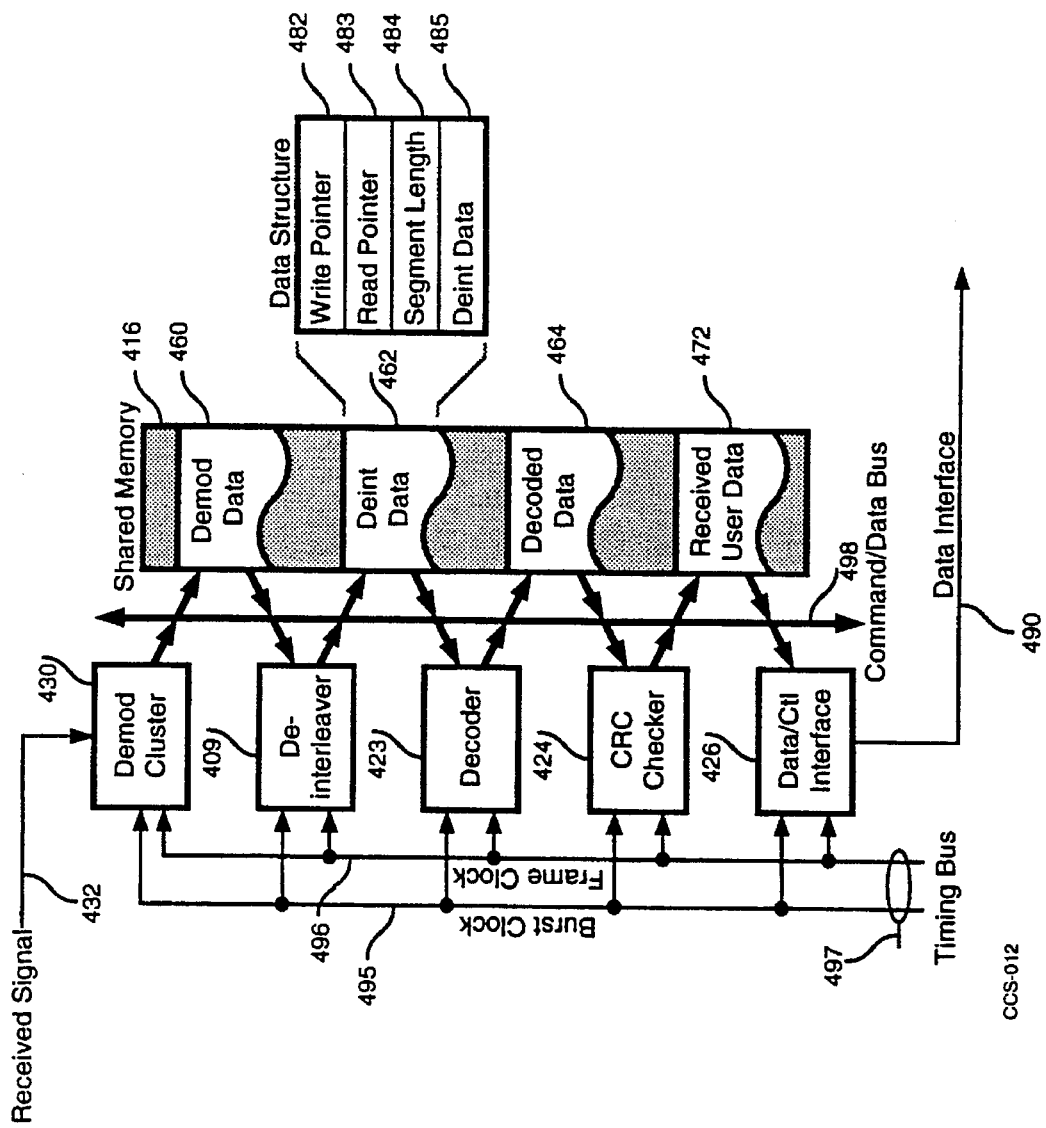
FIG. 6 is a data flow diagram of the modem of FIG. 5.

As illustrated in FIG. 6, data and control are transferred between application syntax via preassigned segments in shared memory syntax 416. Like elements in FIGS. 5 and 6 have like numerals. Associated with each preassigned memory segment (i.e., segments 460, 462, 464, and 472) is a 'write' pointer (such as pointer 482), 'read' pointer (such as pointer 483), 'segment length' value (such as value 484), and the data to be processed (such as deinterleaved data 485). The 'write' pointer is maintained by the application syntax writing the data, while the 'read' pointer is maintained by the application syntax reading the data. Each application syntax examines the 'write' and 'read' pointers to determine if enough data is available to process and will shutdown until the next frame clock epoch when data is not available. In addition to providing inherent power saving, this feature allows data to be processed only when available and at the desired throughput.

The operation of the downlink processing performed by modem 400 is now described. The signaling structure on the downlink incorporates a time-division multiplexed, frequency hopped waveform with varying burst data rates multiplexing communication data, access control data, and synchronization information. The synchronization information is demodulated with the sync correlator 428 for acquiring and tracking the received signal. The communication data and the access control data are demodulated with the PSK demodulator 429. Both application syntax 428 and 429 output data into shared memory syntax 416 for further data processing by other autonomous application syntax.

In modem 400, matched filter 427, sync correlator 428 and PSK demodulator 429 are grouped into a demodulation cluster 430. It demodulates the received signal in real-time at the burst rate and places the demodulated data in shared memory syntax 416. Matched filter 427 matches the communication characteristic of the incoming digital signal, thereby providing filtered samples to sync correlator 428 and PSK demodulator 429. To accommodate the high bandwidth of the filtered signal, the components of demodulation cluster 430 are connected by a high bandwidth bus, called the filtered signal bus 431.

In modem 400, centralized control of the demodulation cluster 430 is performed by the downlink de-randomizer 404. Specifically, the downlink de-randomizer 404 performs the following functions:

(1) generates and synchronizes the PN-Code word, (2) calculates the hopped carrier frequency, (3) generates the corresponding frequency command and strobe for a downlink synthesizer external to modem 400, (4) generates all the necessary clocks, including burst clock and frame clock, and (5) configures the demodulation cluster 430 on a burst-by-burst basis.

Configuration of the demodulation cluster 430 consists of setting up the matched filter 427 to the burst data, and selecting either sync correlator 428 or PSK demodulator 429. Based on a generated PN-Code, the downlink de-randomizer 404 identifies the incoming burst index. Using this identified burst index, the downlink de-randomizer 404 accesses the shared memory syntax 416 to determine the burst configuration parameters contained in the downlink "command template". The command template is effectively the CASP instruction program written specifically for this modem application. The information in the command template (program) defines the modem operation and can be changed according to the changing downlink parameters. Information in the command template (program) defines the signal processing commands as well as data processing commands. The signal processing commands are used to configure the demodulation cluster 430, while the data processing commands are used to configure the autonomous data processing syntax.

The downlink de-randomizer 404 writes a timing command (T) to each of the components of the demodulation cluster 430, which configures the demodulation cluster 430 to be activated at the burst clock epoch. Prior to the burst clock epoch, the downlink de-randomizer 404 writes configuration commands (C) to each component of the demodulation cluster 430. The demodulation cluster 430 activates on the burst clock epoch and processes the data as defined in the configuration command supplied by the downlink de-randomizer 404. This is an example of dynamic reconfiguration at the burst clock epoch.

The demodulated data is further processed by autonomous application syntax. These application syntax are activated at the downlink frame clock epoch, process the data, and then shutdown until the next downlink frame clock epoch. This results in substantial power savings during operation. In modem 400, each autonomous application syntax maintains its input and output in shared memory syntax 416. FIG. 6 shows the data flow among the centralized controlled demodulation cluster 430 and the distributed controlled data processing syntax. Signals received by modem 400 on line 432 are demodulated by demodulation cluster 430. The demodulated data is placed in a demodulation data segment 460 of shared memory syntax 416 via command/data bus 498, which consists of a portion of command/data/timing bus 499. This demodulated data is subsequently processed by deinterleaver 409. The result is stored in a deinterleaver data segment 462 in shared memory syntax 416. The deinterleaved data is subsequently processed by decoder 423. The decoded data is stored in a decoded data segment 464 in shared memory syntax 416. The decoded data is then check for errors by CRC checker 424 and placed in a received user data segment 472. The received user data can then be extracted by an external entity via the data/control interface syntax 426 on the external bus 490.

The configuration commands of the autonomous application syntax are provided as part of the downlink command template (program) in shared memory syntax 416. As described previously, the instructions for each of these application syntax consist of two arguments; namely, the command argument (in this case, the configuration command) and the time argument (in this case, the invocation time). Upon invocation, the application syntax will decode the command argument (C) and configure its parameters accordingly. Each application syntax decodes the time argument (T) to determine the invocation epoch. The time argument can be implemented as a command to select either the burst clock 495 or the frame clock 496 of the timing bus 497, which is a part of command/data/timing bus 499, and use it to establish a periodic invocation epoch.

Figure 7:
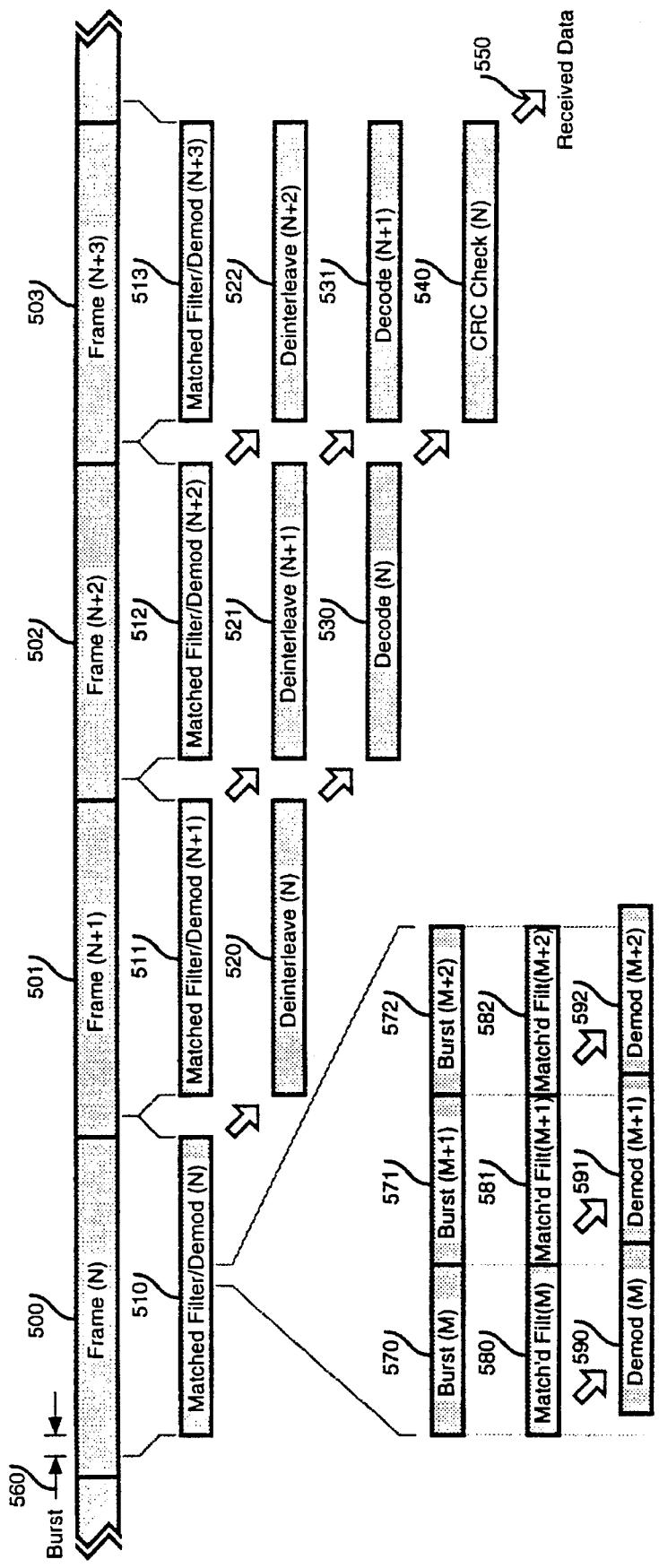
FIG. 7 is a timing diagram showing the pipeline processing feature implemented in the modem of FIG. 5.
Figure 1:
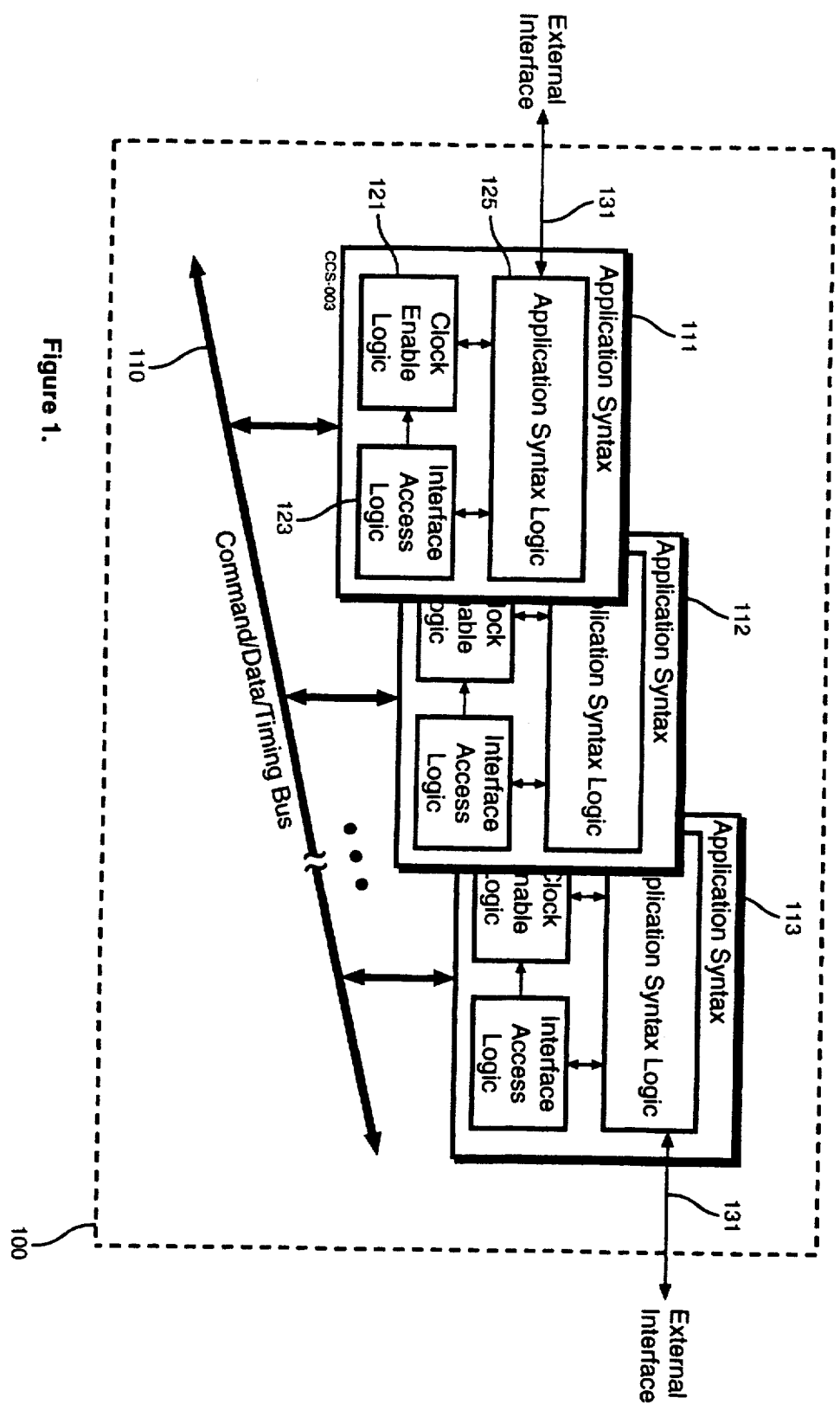

The pipelining capability of the ASP architecture is used in modem 400, where the time arguments of the CASP command template (program) were chosen to perform the above described operations in a processing pipeline. FIG. 7 shows a programmed downlink processing pipeline implemented in modem 400. The input signal on line 432 is demodulated in real time at the burst rate, while deinterleaving, decoding, and CRC checking are processed in subsequent frames at the frame rate.

The downlink processing pipeline implemented in modem 400 is detailed here. Through programming of the application syntax forming modem 400, the received signal 432 is processed in accordance with time on the channel divided into TDMA bursts, with the multiple access duty cycle defined as a frame. In FIG. 7, the progression of time is illustrated as a sequence of frames having sequentially increasing frame numbers. Specifically, the sequence shown in FIG. 7 is frame (N) 500, followed by frame (N+1) 501, followed by frame (N+2) 502, followed by frame (N+3) 503, where N is an arbitrary integer counting the number of flames. Within any given frame, the progression of time is illustrated as a sequence of bursts having sequentially increasing bursts numbers. Specifically, the sequence shown in FIG. 7 is burst (M) 570, followed by burst (M+1) 571, followed by burst (M+2) 572, where M is an arbitrary integer counting the number of bursts within a frame.

The downlink processing pipeline implemented in modem 400 starts with matched filter/demodulation (N) 510 performed on the received data of frame (N) 500. Specifically, the following programmed sequence of operations is performed:

(a) Matched filter (M) 580 is performed on burst (M) 570 of frame (N) 500.

(b) Demodulation (M) 590 is performed on the matched filter (M) 580 output data.

(c) Matched filter (M+1) 581 is performed on burst (M+1) 571 of frame (N) 500.

(d) Demodulation (M+1) 591 is performed on the matched filter (M+1) 581 output data.

(e) Matched filter (M+2) 582 is performed on burst (M+2) 572 of frame (N) 500.

(f) Demodulation (M+2) 592 is performed on the matched filter (M+2) 582 output data.

(g) Et cetera until all designated bursts within frame (N) 500 have been matched filtered and demodulated.

(h) In the following frame, deinterleave (N) 520 is performed on the demodulation (M) 590, demodulation (M+1) 591, demodulation (M+2) 592, etc., output data.

(i) In the following frame, decode (N) 530 is performed on the deinterleave (N) 520 output data.

(j) In the following frame, CRC check (N) 540 is performed on the decode (N) 530 output data.

(k) In the following frame, received data 550 is extracted from the CRC check (N) 540 output data and passed to an external entity.

Similarly, frame (N+1) is processed as follows:

(a) Matched filter (M) 580 is performed on burst (M) 570 of frame (N+1) 501.

(b) Demodulation (M) 590 is performed on the matched filter (M) 580 output data.

(c) Matched filter (M+1) 581 is performed on burst (M+1) 571 of frame (N+1) 501.

(d) Demodulation (M+1) 591 is performed on the matched filter (M+1) 581 output data.

(e) Matched filter (M+2) 582 is performed on burst (M+2) 572 of frame (N+1) 501.

(f) Demodulation (M+2) 592 is performed on the matched filter (M+2) 582 output data.

(g) Et cetera until all designated bursts within frame (N+1) 501 have been matched filtered and demodulated.

(h) In the following frame, deinterleave (N+1) 521 is performed on the demodulation (M) 590, demodulation (M+1) 591, demodulation (M+2) 592, etc., output data.

(i) In the following frame, decode (N+1) 531 is performed on the deinterleave (N+1) 521 output data.

(j) In the following frame, CRC check (N+1) 541 is performed on the decode (N+1) 531 output data.

(k) In the following frame, received data 550 is extracted from the CRC check (N+1) 541 output data and passed to an external entity.

The downlink processing pipeline continues indefinitely with the same pattern repeating until modem 400 is reconfigured into a different mode or turned off.

The programming capability of the CASP modem 400 allows any application syntax to be commanded by the time argument to select one of the clocks provided on the command/data/timing bus 499 and use the selected clock to generate invocation epochs by counting modulo (N) of the selected epoch or invoke when the selected clock reaches a specific value. For example, the CASP command template (program) defines the specified encoder invocation period to consist of multiple frames. In this example, the encoder input data will accumulate in its designated shared memory segment until processed by the encoder upon invocation.

Because it is obvious for persons skilled in the art to build the uplink portion of modem 400 once the downlink portion is understood, only the downlink portion needs to be described. Consequently, the structure and operation of the uplink portion is not described here.

What is described is the ASP architecture of the present invention. It should be obvious to one of ordinary skill in the art to apply the invention to various types of applications. While only several preferred embodiments of the invention have been presently described in detail herein, many alterations and modifications can be made without departing from the spirit and the scope of the invention. Accordingly, it is intended that the scope of the invention is only limited by the appended claims.

What is claimed is:

1. A programmable processor architecture for execution of instructions in a communications system comprising:

an integrated circuit having a plurality of physical application elements interconnected on a command/data/timing bus to cooperatively perform a plurality of communication functions useful in a communications system;

some of the application elements having;

an application element logic block for performing a predefined communications function;

a clock enable logic block for providing the respective application element with timing signals and enabling the application element logic block at the time its function is needed; and, an interface logic access block for allowing the application element logic block to receive commends and data from and send commands and data to other aplication elements over the command/data/timing bus;

and being responsive to an instruction associated with the corresponding application element, each instruction having;

a command argument to set control parameters of the application element; and, a time argument to determine the time the application element is invoked.

2. The architecture as recited in claim 1 wherein the instructions are selected from a library of instructions.

3. The architecture as recited in claim 1 wherein some of the instructions invoke the corresponding application elements simultaneously to operate the respective application elements in a parallel processing mode.

4. The architecture as recited in claim 1 wherein some of the instructions invoke the corresponding application elements in a staggered manner to operate the respective application elements in a pipeline processing mode.

5. The architecture as recited in claim 1 wherein some of the application elements operate asynchronously.

6. The architecture as recited in claim 1 wherein at least one of the application elements performs functions relating to wireless communication.

7. The architecture as recited in claim 1 wherein the interface block is substantially the same for all of the application elements.

8. The architecture as recited in claim 7 wherein the interface block in the application elements comprises a programable interface to the bus.

9. The architecture as recited in claim 1 wherein each clock enable block sends a start signal and a done signal to its corresponding functional block for switching the functional block to the active state by the start signal, and for switching the functional block to the power-down state by the done signal.

10. The architecture as recited in claim 1 wherein at least one of the application elements contains a program for implementing the specified application, and the element invokes at least one other application element by sending at least one of a configuration command argument and an invocation time argument to the other application element.

11. The architecture as recited in claim 1 wherein at least one of the application elements accepts at least one of a configuration command argument and an invocation time argument from another application element.

12. The architecture as recited in claim 1 wherein at least two of the application elements form a cluster, and the application elements in the cluster are connected together by another bus.

13. The architecture as recited in claim 1 wherein at least one of the application elements is a shared memory element.

14. The architecture as recited in claim 13 wherein at least one of the application elements receives input data from the shared memory element and stores output data in the shared memory element.

15. The architecture as recited in claim 1 wherein at least one of the application elements controls the operation of at least one other application element by transmitting control signals thereto via a bus.

16. The architecture as recited in claim 15 wherein the controlling application element further transmits clock signals to the controlled application element via the bus, the operation of the controlled application element being affected by the clock signals.

17. The architecture as recited in claim 15 wherein the control signal includes a command for configuring the controlled application element.

18. The architecture as recited in claim 1 wherein at least one of the application elements comprises a generic state machine containing microcode, the state machine operating in conjunction with the microcode to implement its corresponding instruction.

* * * * *

UNITED STATES PATENT AND TRADEMARK OFFICE
CERTIFICATE OF CORRECTION

PATENT NO. : 5,623,684
DATED : April 22, 1997
INVENTOR(S) : El-Ghoroury et al.

It is certified that error appears in the above-identified patent and that said Letters Patent is hereby corrected as shown below:

On the title page, item [73] Assignee, please delete " Commquest " and insert -- CommQuest --.

Please delete " Figure 1 " of the drawing sheets and insert the attached Figure 1.

In column 10, line 24 (Table 2), please delete " Quatemary " and insert -- Quaternary --.

Signed and Sealed this

Tenth Day of March, 1998

Attest:

BRUCE LEHMAN

Attesting Officer

Commissioner of Patents and Trademarks